United States Patent
Greenstreet et al.

(10) Patent No.: US 6,486,721 B2
(45) Date of Patent: Nov. 26, 2002

(54) LATCH CONTROL CIRCUIT FOR CROSSING CLOCK DOMAINS

(75) Inventors: Mark R. Greenstreet, Vancouver (CA); Josephus C. Ebergen, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/798,662

(22) Filed: Mar. 2, 2001

(65) Prior Publication Data

US 2002/0121922 A1 Sep. 5, 2002

(51) Int. Cl.[7] ............................................. H03K 3/356
(52) U.S. Cl. ........................................ 327/211; 327/213

(58) Field of Search ................................. 327/200–204, 327/205–208, 210–214, 219, 224, 225; 375/219, 220, 226, 362, 354

(56) References Cited

U.S. PATENT DOCUMENTS

| | | | | |
|---|---|---|---|---|
| 5,867,541 A | * | 2/1999 | Tanaka et al. | 370/516 |
| 5,949,266 A | * | 9/1999 | Hinds et al. | 327/208 |
| 6,009,131 A | * | 12/1999 | Hiramatsu | 375/354 |

* cited by examiner

Primary Examiner—My-Trang Nu Ton
(74) Attorney, Agent, or Firm—Philip H. Albert; Townsend and Townsend and Crew LLP

(57) ABSTRACT

A latch control circuit for overcoming phase uncertainty between crossing clock domains, which includes an interface and control circuit for controlling and communicating data between the clock domains and, which also includes either static or dynamic initialization circuitry.

16 Claims, 5 Drawing Sheets

LATCH CONTROL CIRCUIT FOR CROSSING CLOCK DOMAINS

CROSS-REFERENCES TO RELATED APPLICATIONS

A related application is U.S. pat. application Ser. No. 09/767,430 in the names of Ivan Sutherland, Scott Fairbanks and Josephus C. Ebergen and entitled "Asymmetric Control Structure for an Asynchronous Pipeline" and assigned to the resent assignee. That application is hereinafter referred to as "Sutherland" and is incorporated by reference herein for all purposes.

BACKGROUND OF THE INVENTION

This invention relates to latch control circuitry. More specifically, this invention relates to a particular latch control circuit for communicating between clock domains that have clocks of the same frequency, but which may be out of phase.

Advances in integrated circuit fabrication technology continue to lead to systems with higher clock speeds and larger gate counts. As a consequence, wiring delays can be comparable to or greater than the clock period and the difference in delays of the clock signal to different points in the system, commonly referred to as "clock skew," limits the speed at which large synchronous circuits can operate. To simplify the design process, circuit designers typically partition large circuits into several smaller circuits having their own "clock domain". Often all of these clock domains receive their clock from a common clock generator so that the clock frequency is the same for all domains. However, because distribution delays of the clock vary from one domain to the next, the phase difference between different clock domains can be significant and difficult to determine.

One method of overcoming phase uncertainty between different clock domains is to use a source synchronous design, which utilizes a first-in-first-out (FIFO) buffer for communication between clock domains. Two common types of FIFOs used in such a design are the pointer FIFO and the ripple FIFO. The pointer FIFO typically comprises two counters and a dual-port register file that is read from and written to according to read and write pointers derived from the counters. While these are commonly used, they require a substantial amount of support and control circuitry, including address decoder circuitry and circuitry to implement the read and write pointer functions. The ripple FIFO comprises a latch to hold data and control circuitry to regulate the transfer of data between stages. A state bit in the control circuitry marks a stage as either "empty" or "fall." When stage i is full and stage i+1 is empty, the control circuitry of stages i and i+1 enable latch i+1 to acquire a data item from stage i. Along with this data transfer, the state bit of stage i moves to an empty state, and the state bit of stage i+1 moves to a full state.

SUMMARY OF THE INVENTION

In an exemplary embodiment of the present invention, a latch control circuit for overcoming phase uncertainty between crossing clock domains is provided. The latch control circuit includes an interface and control circuit for controlling the communication of data between the two domains.

In a first aspect of the invention, a latch control circuit for conveying data from a clock domain of a transmitter to a clock domain of a receiver is disclosed. The latch control circuit comprises: a data path having a transmitter latch controlled by a transmitter clock in a first clock domain, a receiver latch controlled by a receiver clock in a second clock domain, and an intermediate latch coupled between the transmitter and receiver latches; an interface and control circuit coupled between the transmitter clock and the receiver clock, the interface and control circuit including a clock generator having inputs controlled by delayed versions of the transmitter and receiver clocks and an output coupled to the intermediate latch for controlling the conveyance of a data item from the transmitter latch to the receiver latch.

In a second aspect of the invention, clock edge-to-level converters are included within the latch control circuit described in reference to the first aspect of the invention. A transmitter clock edge-to-level converter includes an input coupled to the transmitter clock, via a first delay that is greater than or equal to zero, and an output coupled to a first end of a first keeper circuit. The transmitter clock edge-to-level converter is operable to convert an edge of the transmitter clock to a logic level. A receiver clock edge-to-level converter is also included and has an input coupled to the receiver clock, via a second delay that is greater than or equal to zero, and an output coupled to a first end of a second keeper circuit. The receiver clock edge-to-level converter is operable to convert an edge of the receiver clock to a logic level. Further, the clock generator is configured to send a clock signal to the intermediate latch when the inverse of the logic level is asserted at first and second inputs of the clock generator.

In a third aspect of the invention, the clock generator described in reference to the second aspect of the invention, comprises a NAND logic gate having a first input coupled to the second end of the first keeper circuit, a second input coupled to the second end of the second keeper circuit and an output; and an inverter having an input coupled to the output of the NAND gate and an output that provides the clock signal to the intermediate latch.

In a fourth aspect of the invention, the latch control circuit, described in reference to the first aspect of the invention, includes static initialization circuitry comprising a first latch having a clock input coupled to the inverse of the transmitter clock, via a first delay that is greater than or equal to zero, an input selectively coupled to a transmitter reset signal and an output coupled to the input of the transmitter clock edge-to-level converter; a second latch having a clock input coupled to the inverse of the receiver clock, an input, and an output coupled to the input of the receiver clock edge-to-level converter; and a third latch having a clock input coupled to the receiver clock, an input selectively coupled to a receiver reset signal and an output coupled to the input of the second latch.

In a fifth aspect of the invention, a latch control circuit including dynamic initialization circuitry is disclosed.

A further understanding of the nature and advantages of the inventions herein may be realized by reference to the remaining portions of the specification and the attached drawings.

DESCRIPTION OF THE SPECIFIC EMBODIMENTS

Figure 1:
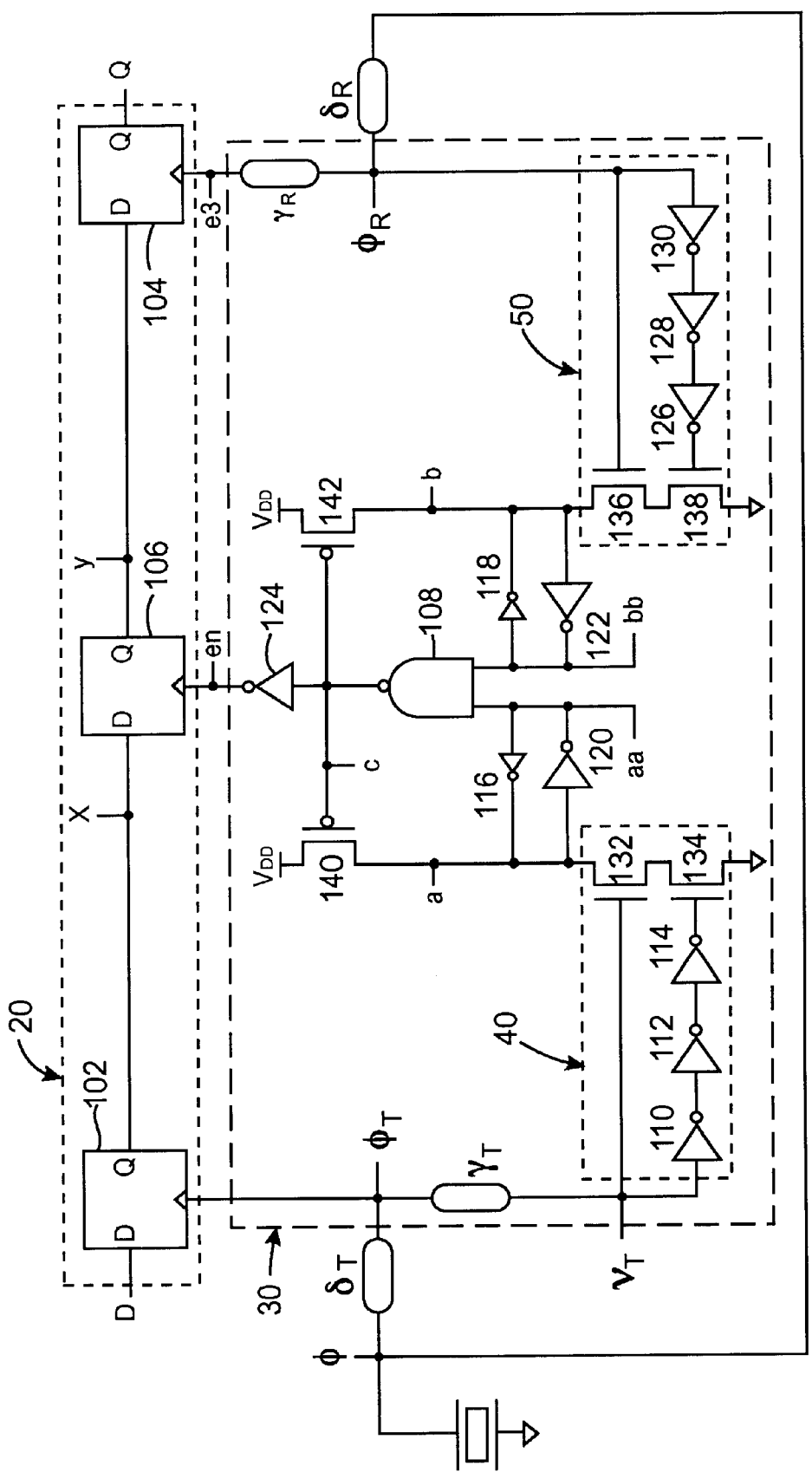
FIG. 1 shows a schematic diagram of an exemplary latch control circuit according to one embodiment of the present invention.

FIG. 1 shows a latch control circuit 10 that compensates for phase differences between crossing clock domains, according to an embodiment of the present invention. Latch control circuit 10 generally comprises a data path circuit 20 that is coupled to an interface and control circuit 30. Interface and control circuit 30 is coupled between a transmitter latch 102 and a receiver latch 104 of data path circuit 20 and functions to control the conveyance of individual data items from a transmitter clock domain to a receiver clock domain. Interface and control circuit 30 comprises NAND logic gate 108, inverter 124, edge-to-level converters 40 and 50, which are coupled to a first "keeper" comprising inverters 116 and 120 and a second keeper comprising inverters 118 and 122, respectively. Also included are p-channel pull-up transistors 140 and 142, which are coupled to nodes a and b, respectively. Together, NAND logic gate 108 and inverter 124 function as a clock generator for controlling the conveyance of a data item from transmitter latch 102 to receiver latch 104. The function and operation of edge-to-level converters 40 and 50, the keepers and the clock generator are described in more detail below.

As shown in FIG. 1, a transmitter clock, $\Phi_T$, in the transmitter clock domain and a receiver clock, $\Phi_R$, in the receiver clock domain both derive from a single master clock, $\Phi$. Generally, interface and control circuit 30 operates to communicate data from transmitter latch 102 to receiver latch 104 despite a possible phase difference between $\Phi_T$ and $\Phi_R$. The input signal D of latch control circuit 10 is from within the transmitter clock domain and must satisfy the set-up and hold requirements of transmitter latch 102. The output signal Q of latch control circuit 10 includes data output from receiver latch 104.

Operation of latch control circuit 10 in FIG. 1 will now be described in relation to an exemplary timing diagram shown in FIG. 2. For this discussion it is assumed that both the transmitter latch 102 and the receiver latch 104 are positive edge triggered, though one skilled in the art would understand that with small adjustments other triggering mechanisms could be used as well, for example, level sensitive or pulse triggered. Also, for sake of discussion, it is assumed that both clocks $\Phi_T$ and $\Phi_R$ are initially low and the voltage levels at both nodes a and b are initially high.

Figure 2:
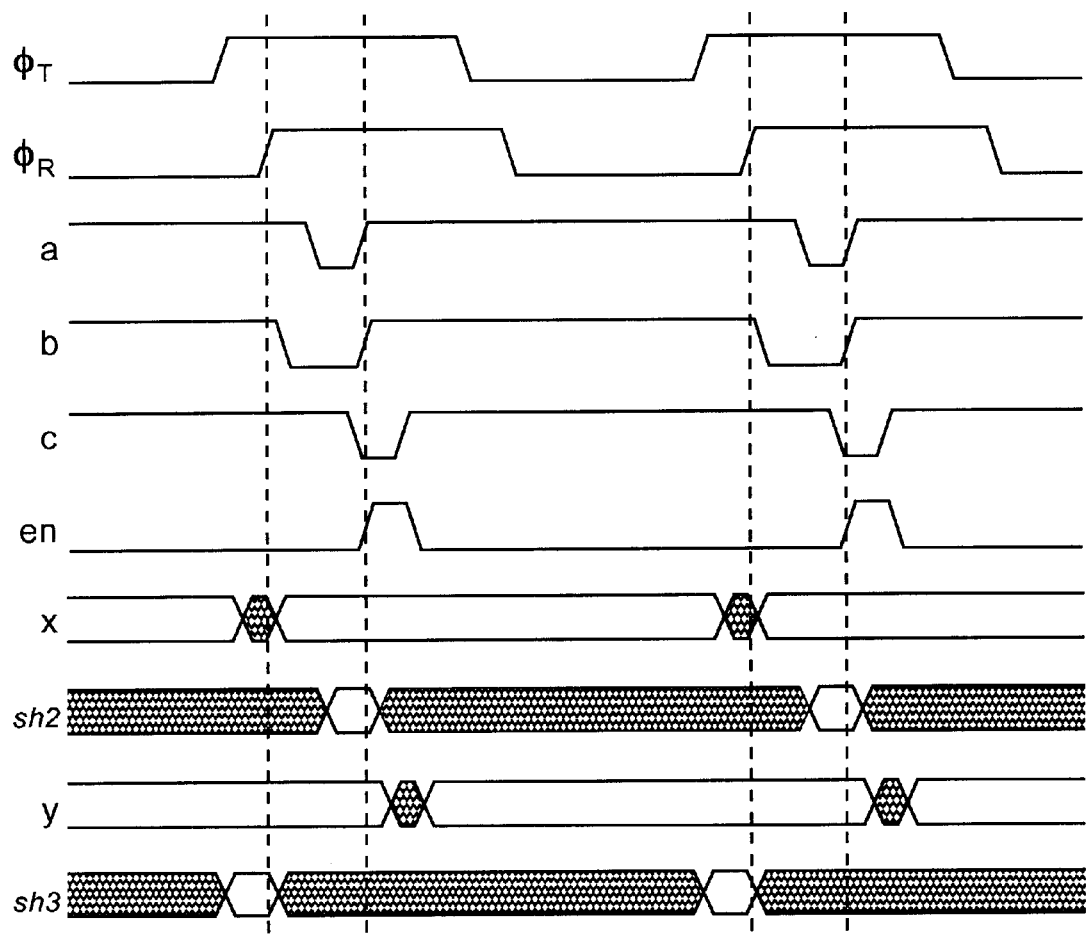
FIG. 2 shows an exemplary timing diagram showing the relative timing of signals at various nodes of the latch control circuit shown in FIG. 1.

Referring to FIGS. 1 and 2, when $\Phi_T$ rises, transmitter latch 102 transfers a data item at D to node x. The hashed portion of the signal at node x in FIG. 2 indicates the times at which the signal at node x may be in transition. The unhashed portion indicates where the signal at node x is guaranteed to be stable.

A rising edge of $\Phi_T$ not only triggers transmitter latch 102 but it also propagates to node $v_T$, via a delay $\gamma_T$. Node $v_T$ provides an input to edge-to-level converter 40. Edge-to-level converter 40 functions to convert a detected rising edge of $\Phi_T$ to a low voltage level. Once $\Phi_T$ rises to its high level, n-channel transistor 132 turns on and node a is temporarily pulled low, since just prior to the rising edge of $\Phi_T$ n-channel transistor 134 is conducting. The rising edge of $\Phi_T$ also propagates to the gate of n-channel transistor 134, but is delayed by the three gate delays presented by inverters 110–114. The presence of the odd number of inverters 110–114 functions to invert $\Phi_T$ so that when it reaches transistor 134, transistor 134 turns off, thereby decoupling the conductive path to ground.

Similarly, a rising edge of $\Phi_R$ propagates to n-channel transistor 136, which provides an input for edge-to-level converter 50. Edge-to-level converter 50 functions to convert a detected rising edge of $\Phi_R$ to a low voltage level. Once $\Phi_R$ rises to its high level, n-channel transistor 136 turns on and node b is temporarily pulled low, since just prior to the rising edge of $\Phi_R$ n-channel transistor 138 is conducting. The rising edge of $\Phi_R$ also propagates to the gate n-channel transistor 138, but is delayed by three gate delays presented by inverters 126–130. The presence of the odd number of inverters 126–130 functions to invert $\Phi_R$ so that when it reaches transistor 138, transistor 138 turns off, thereby decoupling the conductive path to ground. Note that delay $\gamma_T$ is long enough so that for the indicated phase offset between $\Phi_T$ and $\Phi_R$, node a falls after node b and both nodes a and b are low for a certain span of time.

After the edge-to-level conversions of the delayed versions of $\Phi_T$ and $\Phi_R$ propagate through inverters 120 and 122, respectively, the inputs to NAND gate 108, nodes aa and bb, become high and, consequently, NAND gate 108 provides a low output to node c. The low output at node c is inverted by inverter 124 to provide a high output at node en. The high output at node en triggers latch 106 so that the data item at node x is transferred to node y in data path circuit 20. The low output at node c also turns on p-channel transistors 140 and 142, which, when turned on, pull nodes a and b high, thereby resetting nodes aa and bb to a low value. The resetting process is similar to that described in Sutherland.

Pseudo-signal sh2, in FIG. 2, depicts the set-up and hold window for latch 106. The input to latch 106, at node x, may safely change in the hashed regions but must be stable in the unhashed regions. The set-up time is measured from the left edge of the unhashed region to the rising edge of the signal at node en. For proper operation, data loaded into transmitter latch 102, on a rising edge of $\Phi_T$, must be loaded into latch 106 on the corresponding rising edge of the signal at node en. This means that the delay of a rising edge of $\Phi_T$ through nodes $v_T$, a, c and en must be large enough to ensure that the set-up time requirement of latch 106 is satisfied for the data propagated through transmitter latch 102 by the same rising edge of $\Phi_T$. The value of delay $\gamma_T$ is chosen to satisfy this condition.

Data is acquired by receiver latch 104 on the first rising edge of $\Phi_R$ following a rising edge of the signal provided to node en. To satisfy the hold time requirement for receiver latch 104, a data item at node y must remain stable after a rising edge of the signal at node e3 until the hold time requirement of receiver latch 104 is satisfied. Specifically, the delay of a rising edge of $\Phi_R$ through nodes b and c to node en and subsequently to data at node y becoming valid must be greater than the delay through $\gamma_R$ plus the hold time associated with receiver latch 104.

Latch control circuit 10 will function properly so long as the skew between $\Phi_T$ and $\Phi_R$ is maintained within certain limits. These limits are dictated by data path circuit 20 and interface and control circuit 30 of latch control circuit 10. With respect to data path circuit 20, $\Phi_R$ can occur earlier, relative to $\Phi_T$, before latch control circuit 10 malfunctions, if and only if (1) the signal at node c returns to a high value prior to n-channel transistor 136 catching the next rising edge of $\Phi_R$ and (2) the set-up and hold window for receiver latch 104 does not overlap the time interval when the signal at node y can be changing.

Figure 3A:
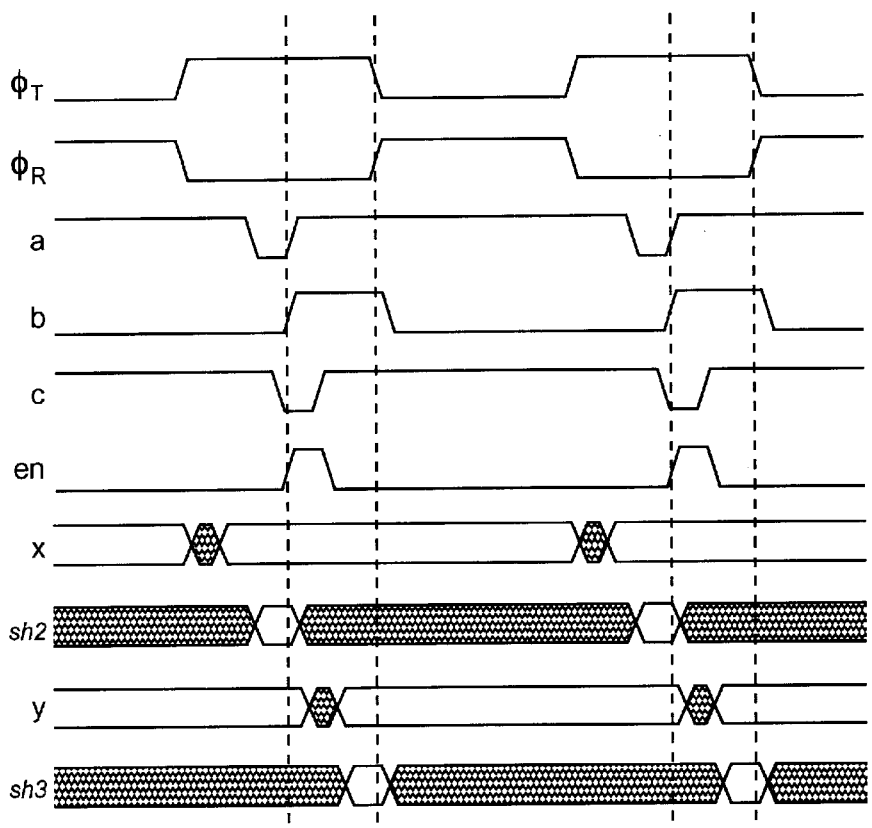
FIGS. 3A and 3B show timing diagrams that illustrate the maximum skew tolerance between a receiver clock and a transmitter clock for the latch control circuit shown in FIG. 1.

FIG. 3A illustrates the condition in which $\Phi_R$ is advanced as early as possible, relative to $\Phi_T$, given the two constraints above. Under these conditions, and focusing on data path 20, transmitter latch 102 is triggered by a rising edge of $\Phi_T$ to transfer a data item from node D to node x. The rising edge of $\Phi_T$ also propagates directly through the control circuitry to trigger latch 106 so that the data item is transferred to node y. As is shown in FIG. 3A, since $\Phi_R$ is advanced as early as possible, the propagation of the data item to node y is completed just prior to the next rising edge of $\Phi_R$. Thus the data item propagates through all three latches in the minimal time possible. Focusing now on interface and control circuit 30, constraint (2) above requires that the set-up and hold window for receiver latch 104 does not overlap the time interval when the signal at node y can be changing. Accordingly, in FIG. 3, the early limit for $\Phi_R$ is determined by the last moment that node y can change plus the set-up time of latch 104.

Looking at the other extreme, $\Phi_R$ can by delayed, relative to $\Phi_T$, before latch control circuit 10 malfunctions, if and only if (1) the signal at node c returns to a high value prior to n-channel transistor 132 catching the next rising edge of $\Phi_T$ and (2) the set-up and hold window for latch 106 is not delayed to the point of overlapping the interval in which the signal at node x changes in response to the next rising edge of $\Phi_T$.

Figure 3B:
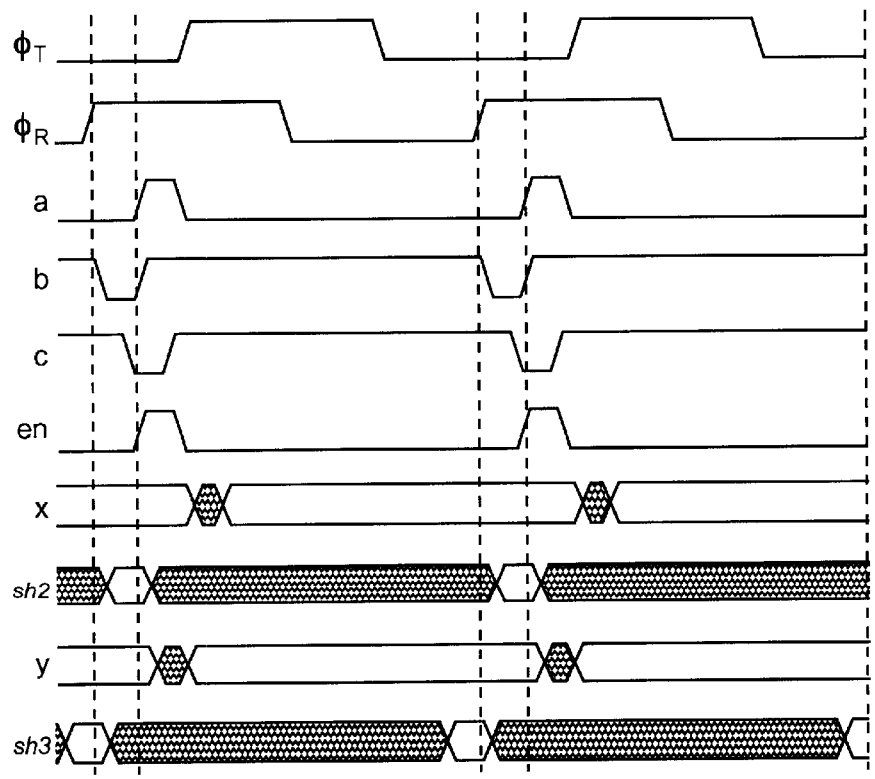

FIG. 3B shows the condition in which $\Phi_R$ is delayed as much as possible, relative to $\Phi_T$, given the two constraints above. Focusing again on data path circuit 20, as $\Phi_R$ is made later than $\Phi_T$, the triggering of both latch 106 and the receiver latch 104 are delayed. Consequently, a data item sits on node x longer before being acquired by latch 106. If $\Phi_R$ is delayed to the point where a next positive transition is received at transmitter latch 102 before latch 106 has acquired the previous data item from transmitter latch 102, the data path malfunctions. Focusing now on interface and control circuit 30, the late limit for $\Phi_R$ is determined by the time of the next rising edge of $\Phi_T$ minus the time from the rising edge of $\Phi_R$ until c returns high (i.e. a control operation initiated by $\Phi_R$, where the "next rising edge of $\Phi_T$" corresponds to the rising edge of $\Phi_T$ immediately following the aforementioned rising edge of $\Phi_R$. Hence, the total range allowed by the control path is two clock periods (the time from the "previous rising edge of $\Phi_T$" to the "next rising edge of $\Phi_T$") minus the times for two control operations (one initiated by $\Phi_T$ and the other initiated by $\Phi_R$).

Before the latch control circuit 10 can function continuously without error, it must be initialized. A first step in the initialization process involves computing the minimum and maximum latencies of latch control circuit 10. Here, latency is generally defined as the value for $\lambda$ where for every value of $i \geq 0$ the data item loaded into latch 102 at the $(1+i)$th rising clock edge of $\Phi_T$, denoted by $\Phi_T(1+i)$, is loaded into latch 104 at the $(\lambda+i)$th rising clock edge of $\Phi_R$, denoted by $\Phi_R(\lambda+i)$.

Figure 4A:
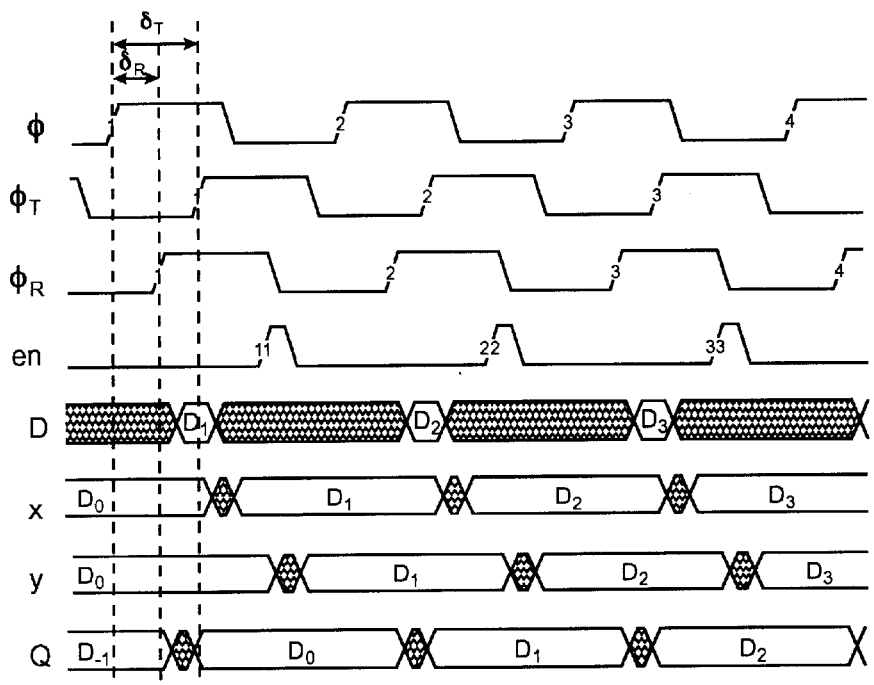
FIGS. 4A and 4B show timing diagrams that illustrate a latency of two and one, respectively, for the latch control circuit shown in FIG. 1.
Figure 4B:
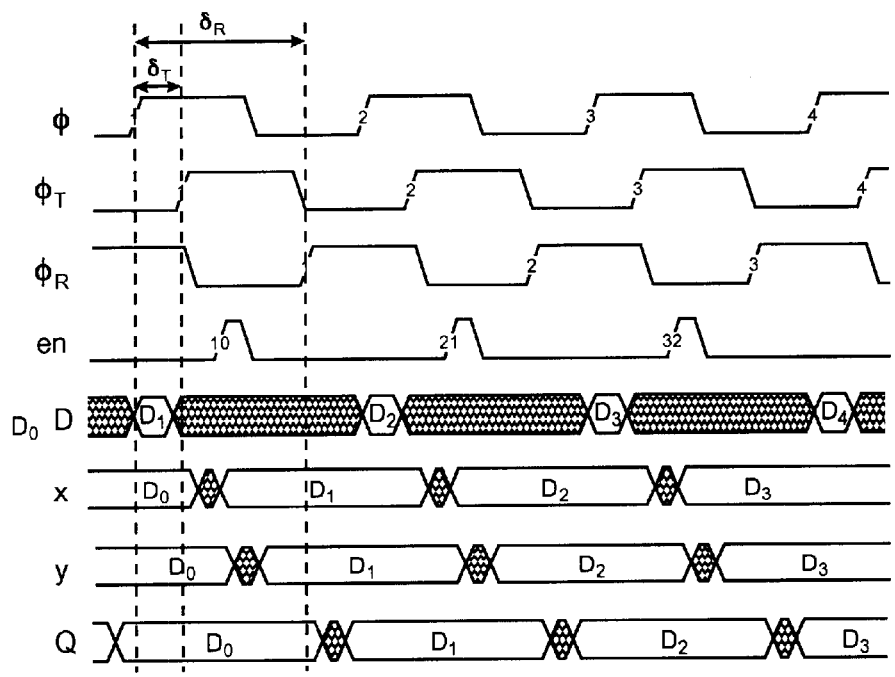

FIGS. 4A and 4B show timing diagrams for the situations where the latency, $\lambda$, is equal to two and one, respectively. In FIG. 4A, rising edge $\Phi_T(i)$ occurs just slightly after rising edge $\Phi_R(i)$. Further, the rising edges $\Phi_T(i)$ and $\Phi_R(i)$ are paired such that NAND gate 108 provides a low output when a pair causes the signals at nodes aa and bb to both turn high. The pairings of $\Phi_T(i)$ and $\Phi_R(i)$ are represented by numbers positioned near the rising edges of the two clocks. Each pairing generates an event on node en labeled 11, 22, etc. In FIG. 4B, rising edge $\Phi_T(i)$ (i $\geq 1$) occurs before $\Phi_R(i)$ and rising edge $\Phi_T(i)$ is paired with rising edge $\Phi_R(i-1)$. This situation produces a latency equal to one.

Figure 5:
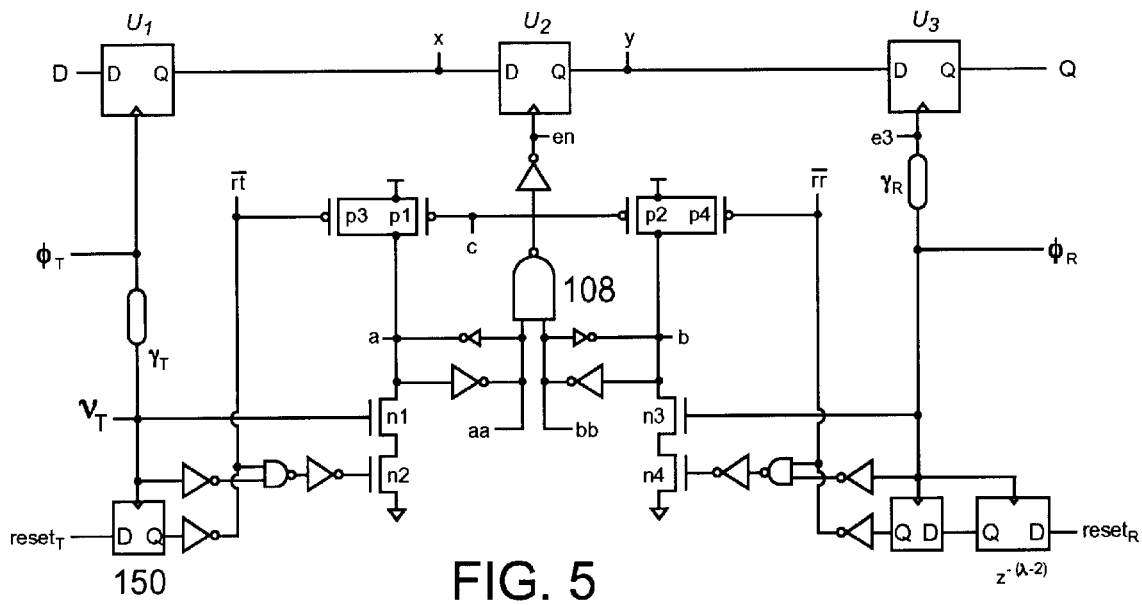
FIG. 5 shows an exemplary latch control circuit including static initialization circuitry according to an embodiment of the present invention.

If $\lambda$ has been computed, one can opt to use static initialization to place the latch control circuit 10 in a proper initial state. FIG. 5 shows an exemplary latch control circuit having static initialization circuitry according to one embodiment of the present invention, which can be used for $\lambda$ equal to two or three. The module labeled $z^{-(\lambda-2)}$ is a $\lambda-2$ cycle delay. When the reset signals, $reset_T$ and $reset_R$ are asserted, both nodes a and b are forced to high levels, i.e. the state where NAND gate 108 is waiting for a rising edge from both $\Phi_T$ and $\Phi_R$. When the reset signals are released, the transmitter path is enabled $\lambda-2$ cycles prior to the receiver path. This establishes $\lambda$ cycles of latency and allows the rising edges of $\Phi_T$ and $\Phi_R$ to be appropriately paired up. If $\lambda$ is less than two, then a delay of $2-\lambda$ cycles should be placed in the $reset_T$ path. Preferably, the reset signal, $reset_T$, is synchronous to $\Phi_T$.

Figure 6:
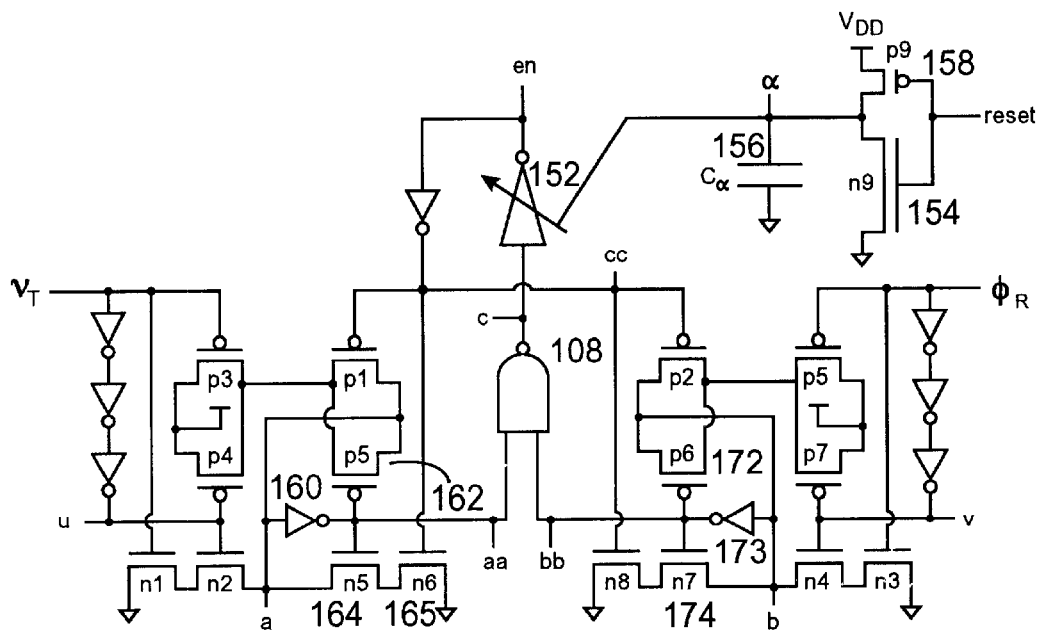
FIG. 6. shows an exemplary latch control circuit including dynamic initialization circuity according to an embodiment of the present invention.

Dynamic initialization is used if, for a particular design, it is difficult to determine the bounds of the clock phase differences between $\Phi_T$ and $\Phi_R$. Also the difference between the maximum and minimum phase delays between $\Phi_T$ and $\Phi_R$ may be too large to use static initialization. An exemplary circuit diagram of a latch control circuit implementing dynamic initialization is shown in FIG. 6. The key principle behind dynamic initialization is the employment of an adjustable delay 152 between the output of NAND gate 108 and back to one of its inputs. Initially, after the reset signal is asserted, n-channel transistor 154 is turned on, thereby pulling node $\alpha$ low. The delay through delay element 152 is longer the lower the voltage is at node $\alpha$. Accordingly, the delay is longest at the beginning of the initialization process. After the reset signal is released, transistor 154 turns off and capacitor 156 slowly charges from the supply, VDD, through p-channel transistor 158. Initially, the delay is so large that there is not enough time between clock cycles for node c to reset, via a control operation as was described above. Eventually, however, the delay is small enough for a reset at node c to be established. Once node c is reset high, rising edges of $\Phi_T$ and $\Phi_R$ eventually become paired as the delay of delay element 152 further decreases. Once paired, the circuit is initialized.

In addition to including dynamic initialization circuitry, the latch control circuit of FIG. 6 also employs strong keepers for nodes a and b. The keepers are "strong" compared to the keepers between nodes a and aa and b and bb of the latch control circuit shown in FIG. 1, since they do not rely upon weak inverters 116 and 118. For the transmitter side of the circuit, the strong keeper comprises inverter 160, p-channel transistor 162 and n-channel transistor 164. Similarly, in the receiving side of the circuit, the strong keeper comprises inverter 170, p-channel transistor 172 and n-channel transistor 174. Focusing on the transmitter side of the circuit, p-channel transistor 162 functions as a pull-up transistor when the output of inverter 160 is low and n-channel transistor 164 functions as a pull-down transistor when the output of inverter 160 is high. N-channel transistor 165 ensures that transistor 164 is only enabled when node c is high. Rising edges of $v_T$ and $\Phi_R$ briefly disable the pull-up paths for nodes a and b, respectively, even when node c is low. This relaxes the constraint, described above, that node c is allowed to go high prior to the next rising edge of a clock to a constraint that node c must go high prior to the next falling edge at node u or v.

The preceding has been a description of the preferred embodiments of the invention. It will be appreciated that deviations and modifications can be made without departing from the scope of the invention, which is defined by the appended claims.

What is claimed is:

1. A latch control circuit for conveying data from a clock domain of a transmitter to a clock domain of a receiver, comprising:

a data path circuit having a transmitter latch controlled by a transmitter clock in a first clock domain, a receiver latch controlled by a receiver clock in a second clock domain, and an intermediate latch coupled between the transmitter and receiver latches; and an interface and control circuit coupled between the transmitter clock and the receiver clock, the interface and control circuit including a clock generator having first and second inputs controlled by delayed versions of the transmitter and receiver clocks and an output coupled to the intermediate latch for controlling the conveyance of a data item from the transmitter latch to the receiver latch.

2. The latch control circuit of claim 1, further comprising:

a transmitter clock edge-to-level converter having an input coupled to the transmitter clock, via a first delay that is greater than or equal to zero, and an output coupled to a first end of a first keeper circuit, the transmitter clock edge-to-level converter operable to convert an edge of the transmitter clock to a logic level; and a receiver clock edge-to-level converter having an input coupled to the receiver clock, via a second delay that is greater than or equal to zero, and an output coupled to a first end of a second keeper circuit, the receiver clock edge-to-level converter operable to convert an edge of the receiver clock to the logic level, wherein the clock generator is configured to send a clock signal to the intermediate latch when the inverse of the logic level from the transmitter clock edge-to-level converter is asserted at the first input of the clock generator and the inverse of the logic level from the receiver clock edge-to-level converter is asserted at the second input of the clock generator.

3. The latch control circuit of claim 2, wherein:

the first end of the first keeper circuit is coupled to the output of the transmitter clock edge-to-level converter and the first keeper has a second end coupled to the first input of the clock generator, and the first end of the second keeper circuit is coupled to the output of the receiver clock edge-to-level converter and the second keeper has a second end coupled to the second input of the clock generator.

4. The latch control circuit of claim 3, wherein the transmitter clock edge-to-level converter comprises:

a first odd-numbered group of serially connected inverters, the first serial connection having an input coupled to the transmitter clock, via the first delay, and an output;

a first pull-down transistor having a gate coupled to the output of the first serial connection, a source coupled to ground and a drain; and a second pull-down transistor having a gate coupled to the transmitter clock, via the first delay, a drain coupled to the first end of the first keeper circuit and a source coupled to the drain of the first pull-down transistor.

5. The latch control circuit of claim 4, wherein the receiver clock edge-to-level converter comprises:

a second odd-numbered group of serially connected inverters, the second serial connection having an input coupled to the receiver clock, via the second delay and an output; and a third pull-down transistor having a gate coupled to the output of the second serial connection, a source coupled to ground and a drain; and a fourth pull-down transistor having a gate coupled to the receiver clock, via the second delay, a drain coupled to the first end of the second keeper circuit and a source coupled to the drain of the third pull-down transistor.

6. The latch control circuit of claim 3, wherein the clock generator comprises:

a NAND logic gate having a first input coupled to the second end of the first keeper circuit, a second input coupled to the second end of the second keeper circuit and an output; and an inverter having an input coupled to the output of the NAND gate and an output that provides the clock signal to the intermediate latch.

7. The latch control circuit of claim 6, further comprising:

a first pull-up transistor having a gate coupled to the output of the NAND gate, a source coupled to a power supply and a drain coupled to the drain of the second pull-down transistor; and a second pull-up transistor having a gate coupled to the output of the NAND gate, a source coupled to the power supply and a drain coupled to the drain of the fourth pull-down transistor.

8. The latch control circuit of claim 3, wherein the keeper circuits maintain signals asserted at the clock generator inputs at least until a reset condition of the latch control circuit is established.

9. The latch control circuit of claim 3, wherein the first keeper circuit comprises a first inverter coupled between the output of the transmitter clock edge-to-level converter and the first input of the clock generator and a second inverter coupled in parallel and in the opposite direction with the first inverter; and the second keeper circuit comprises a third inverter coupled between the output of the receiver clock edge-to-level converter and the second input of the clock generator and a fourth inverter coupled in parallel and in the opposite direction with the third inverter.

10. The latch control circuit of claim 2, further comprising initialization circuitry, the initialization circuitry comprising:

a first latch having a clock input coupled to the inverse of the transmitter clock, via a first delay that is greater than or equal to zero, an input selectively coupled to a transmitter reset signal and an output coupled to the input of the transmitter clock edge-to-level converter;

a second latch having a clock input coupled to the inverse of the receiver clock, an input, and an output coupled to the input of the receiver clock edge-to-level converter; and a third latch having a clock input coupled to the receiver clock, an input selectively coupled to a receiver reset signal and an output coupled to the input of the second latch.

11. The latch control circuit of claim 10, further comprising:

a reset device controlled by the output of the NAND gate operable to reset the interface and control circuit following the sending of the clock signal to the intermediate latch.

12. The latch control circuit of claim 10, further comprising an adjustable delay element within a circuit path from the output of the NAND gate to an input of the NAND gate.

13. The latch control circuit of claim 12, wherein the adjustable delay element comprises a logic gate having a delay controlled by a voltage applied to it.

14. The latch control circuit of claim 13, wherein the logic gate comprises an inverter.

15. The latch control circuit of claim 13, wherein the voltage is variable and is supplied by a variable voltage generator.

16. The latch control circuit of claim 15, wherein the variable voltage generator comprises:

a capacitor having a first end coupled to a control input of the adjustable delay element and second end coupled to ground;

an n-channel transistor having a gate selectively coupled to a reset signal, a source coupled to ground and a drain coupled to the first end of the capacitor; and a p-channel transistor having a source coupled to a power supply, a drain coupled to the first end of the capacitor and a gate coupled to the reset signal.

* * * * *